United States Patent
Zolfaghari

(10) Patent No.: US 7,957,704 B2
(45) Date of Patent: Jun. 7, 2011

(54) METHOD AND SYSTEM FOR REDUCING AM/PM DISTORTION IN A POLAR AMPLIFIER

(75) Inventor: Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1108 days.

(21) Appl. No.: 11/684,075

(22) Filed: Mar. 9, 2007

(65) Prior Publication Data

US 2008/0150633 A1     Jun. 26, 2008

Related U.S. Application Data

(60) Provisional application No. 60/868,818, filed on Dec. 6, 2006.

(51) Int. Cl.
*H04B 1/66* (2006.01)
*H04B 1/04* (2006.01)

(52) U.S. Cl. .................. 455/102; 455/115.1; 455/127.1; 330/10

(58) Field of Classification Search .................. 455/116, 455/126, 91, 112, 115.1, 127.1, 102, 108, 455/110; 330/149, 251, 295, 150, 151
See application file for complete search history.

(56) References Cited

U.S. PATENT DOCUMENTS

| | | | | |
|---|---|---|---|---|
| 6,771,720 B1 * | 8/2004 | Yang et al. | ..................... | 375/345 |
| 7,058,371 B2 * | 6/2006 | Li et al. | .......................... | 455/116 |
| 7,243,037 B2 * | 7/2007 | Tracht et al. | ................... | 702/106 |
| 7,289,005 B2 * | 10/2007 | Puma | ............................ | 332/145 |
| 7,414,470 B2 * | 8/2008 | Okazaki | ....................... | 330/149 |
| 7,469,130 B2 * | 12/2008 | Mayer et al. | .................. | 455/116 |
| 7,596,184 B2 * | 9/2009 | Ahmed | .......................... | 375/296 |
| 2003/0215025 A1 * | 11/2003 | Hietala | .......................... | 375/297 |
| 2007/0120617 A1 * | 5/2007 | Sato et al. | ..................... | 332/128 |

* cited by examiner

*Primary Examiner* — Sonny Trinh
(74) *Attorney, Agent, or Firm* — McAndrews, Held & Malloy, Ltd.

(57) ABSTRACT

Methods and systems for reducing AM/PM distortion in a polar amplifier are disclosed and may comprise adding an offset signal to an amplitude signal in the digital domain and removing the offset signal in the analog domain during polar modulation. A sum of an amplitude signal and an offset signal may be mixed with a phase signal in a first differential amplifier to generate a first voltage signal, and the offset signal may be mixed with the phase signal in a second differential amplifier to generate a second voltage signal, which may be subtracted from the first voltage signal. The amplitude and offset signals may be mixed with the phase signal by modulating a current in the differential amplifiers, which may comprise cascode differential amplifiers. The modulated current may be generated using a current source and a current mirror circuit, which may comprise a cascode current mirror.

58 Claims, 5 Drawing Sheets

METHOD AND SYSTEM FOR REDUCING AM/PM DISTORTION IN A POLAR AMPLIFIER

CROSS-REFERENCE TO RELATED APPLICATIONS/INCORPORATION BY REFERENCE

This application makes reference to, claims priority to, and claims the benefit of U.S. Provisional Application Ser. No. 60/868,818, filed on Dec. 6, 2006.

The above stated application is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication transmitters. More specifically, certain embodiments of the invention relate to a method and system for reducing AM/PM distortion in a polar amplifier.

BACKGROUND OF THE INVENTION

A power amplification circuit in a wireless system is typically a large signal device. In wireless systems, the power amplifier circuit may transmit output signals at power levels up to 30 dBm, for example. In such wireless systems, which may, for example, utilize modulation types such as binary phase shift keying (BPSK) or 512 level quadrature amplitude modulation (512-QAM), output power levels may vary widely such that the ratio of the peak power level to the average power level may be large, for example, 10 dBm to 15 dBm. Because of these large swings in output power levels, power amplifier (PA) circuits may distort the output signal. Distortion, however, is a characteristic, which may be observed in PA circuits that are utilized across a wide range of applications, and may not be limited to PA circuits utilized in wireless systems. There are two metrics, which may be utilized to evaluate the distortion performance of PA circuits. These metrics may be referred to as amplitude modulation to amplitude modulation (AM-AM) distortion, and amplitude modulation to phase modulation (AM-PM) distortion.

The AM-AM distortion provides a measure of the output power level, $P_{out}$, in response to the input power level, $P_{in}$. The input power level, and output power level are each typically measured in units of dBm, for example. In an ideal, non-distorting, PA circuit, the output power level changes linearly in response to a change in the input power level. Thus, for each $\Delta P_{in}$ change in the input power level there may be a corresponding change in the output power level, $\Delta P_{out} \approx \alpha \Delta P_{in}$, where $\alpha$ represents a constant of linearity. The AM-AM distortion may be observed when, for example, the change in the output power level in response to a first change in input power level may be $\Delta^1 P_{out} \approx \alpha \Delta^1 P_{in}$, where the change in the output level in response to a second change in the input power level may be $\Delta^2 P_{out} \approx \beta \Delta^2 P_{in}$, when $\alpha \neq \beta$.

The AM-PM distortion provides a measure of the phase of the output signal in relation to the input signal (or output phase) in response to the input power level. Output phase is typically measured in units of angular degrees. The AM-PM distortion may be observed when, for example, the output phase changes in response to a change in input power level.

Limitations in the performance of PA circuitry due to distortion may be exacerbated when the PA is integrated in a single integrated circuit (IC) device with other radio frequency (RF) transmitter circuitry such as digital to analog converters (DAC), low pass filters (LPF), mixers, and RF programmable gain amplifiers (RFPGA). Whereas the pressing need to increase the integration of functions performed within a single IC, and attendant increase in the number of semiconductor devices, may push semiconductor fabrication technologies toward increasingly shrinking semiconductor device geometries, these very semiconductor fabrication technologies may impose limitations on the performance of the integrated PA circuitry. For example, utilizing a 65 nm CMOS process may restrict the range of input power levels for which the PA provides linear output power level amplification. Requirements for AM-AM and/or AM-PM distortion levels as set forth in a WLAN standard, such as IEEE 802.11, may preclude transmitting output signals at high output power levels for PA circuitry that is fabricated utilizing a 65 nm CMOS process, for example. An exemplary standard for WLAN systems may specify, for example, that the ratio of the AM-AM distortion to output power level not exceed −25 dBm.

One current approach utilized in an attempt to reduce AM-AM distortion and/or AM-PM distortion involves fabricating PA circuitry in discrete IC devices, which are not integrated with other RF transmitter circuitry. The fabrication processes for these IC devices may utilize gallium arsenide (GaAs) and/or gallium nitride (GaN) materials. Silicon (Si), which is a material utilized in CMOS and various other semiconductor fabrication processes offers several advantages in relation to GaAs and/or GaN. First, silicon is a readily available, and inexpensive, material. Second, Si readily bonds to silicon dioxide ($SiO_2$), a commonly utilized insulating layer during semiconductor manufacturing. Third, the integration of other devices with CMOS circuits is simpler in that many circuits are fabricated on Si and thus would have the same thermal mismatch and other mechanical characteristics.

The discrete IC approach imposes its own limitations, however. One such limitation is that by placing the PA circuitry and other RF transmitter circuitry in discrete IC devices, each device may be required to provide external pins that enable interfacing of the discrete devices. Increasing pin count may increase the manufacturing cost of each IC device. Furthermore, additional external circuitry may be required if the interfaces between the discrete IC devices are not compatible. For example, additional external circuitry may be required if the interface from one discrete IC device utilizes single ended input and output (I/O), while the interface from another discrete IC device utilizes differential I/O.

In another current approach utilized in an attempt to reduce AM-AM distortion and/or AM-PM distortion the input power level may be restricted to a narrower range, which may in turn restrict the maximum output power level. One limitation of this approach in wireless systems is that restricting the maximum output power level may reduce the range over which a system may transmit signals to, for example, a node B element of base transceiver station (BTS) in a wireless network. To the wireless network operator, the reduction in range may require that more node B elements, and/or BTSs be deployed, or risk that wireless network users will experience decreased communications quality, and/or dropped calls when communicating via the network.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for reducing AM/PM distortion in a polar amplifier, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for reducing AM/PM distortion in a polar amplifier, and may comprise adding an offset signal to an amplitude signal in the digital domain and removing the offset signal in the analog domain during polar modulation in a power amplifier. A sum of an amplitude signal and an offset signal may be mixed with a phase signal in a first differential amplifier to generate a first voltage signal, and the offset signal may be mixed with the phase signal in a second differential amplifier to generate a second voltage signal. The second voltage signal may be subtracted from the generated first voltage signal. The amplitude and offset signals may be mixed with the phase signal by modulating a current in the differential amplifiers, which may comprise cascode differential amplifiers. The modulated current may be generated using a current source and a current mirror circuit, which may comprise a cascode current mirror. The polar amplifier may comprise a power amplifier driver or a power amplifier.

Figure 1A:
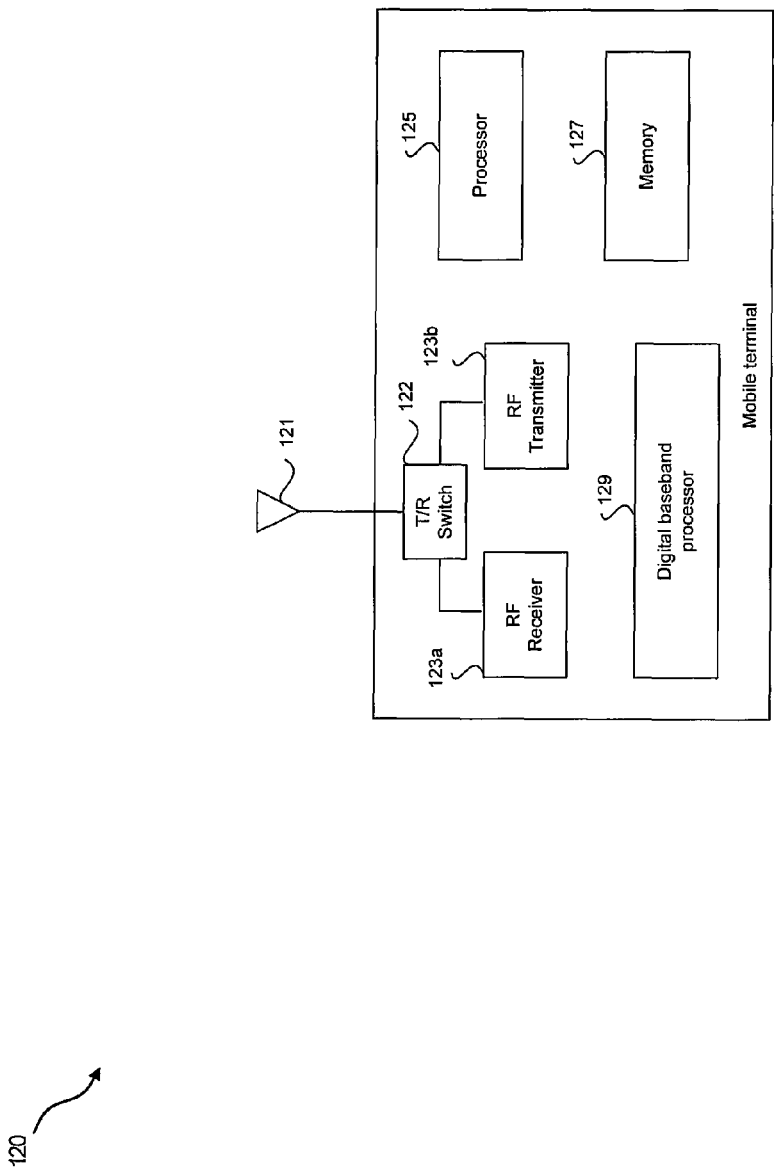
FIG. 1A is a block diagram illustrating an exemplary mobile terminal, which may be utilized in accordance with an embodiment of the invention.

FIG. 1A is a block diagram illustrating an exemplary mobile terminal, which may be utilized in accordance with an embodiment of the invention. Referring to FIG. 1A, there is shown mobile terminal 120 that may comprise an RF receiver 123a, an RF transmitter 123b, a digital baseband processor 129, a processor 125, a transmit/receive (T/R) switch 122, an antenna 121 and a memory 127. The T/R switch 122 may be communicatively coupled to the RF receiver 123a and to the RF transmitter 123b. In instances when the T/R switch 122 is set to "R", or receive, the antenna 121 may be communicatively coupled to the RF receiver 123a, and in instances when the T/R switch 122 is set to "T", or transmit, the antenna 121 may be communicatively coupled to the RF transmitter 123b.

The RF receiver 123a may comprise suitable logic, circuitry, and/or code that may enable processing of received RF signals. The RF receiver 123a may enable receiving of RF signals in frequency bands utilized by various wireless communication systems, such as Bluetooth, WLAN, EDGE/GSM, and/or CDMA, for example.

The digital baseband processor 129 may comprise suitable logic, circuitry and/or code that may enable processing and/or handling of baseband signals. In this regard, the digital baseband processor 129 may process or handle signals received from the RF receiver 123a and/or signals to be transferred to the RF transmitter 123b for transmission via a wireless communication medium. The digital baseband processor 129 may also provide control and/or feedback information to the RF receiver 123a and to the RF transmitter 123b, based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the wireless communication medium.

The RF transmitter 123b may comprise suitable logic, circuitry, and/or code that may enable processing of RF signals for transmission. The RF transmitter 123b may enable transmission of RF signals in frequency bands utilized by various wireless communications systems, such as GSM and/or CDMA, for example.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the mobile terminal 120. For example, the memory 127 may comprise information necessary to configure the RF receiver 123a to enable receiving RF signals in the appropriate frequency band.

In operation, the digital baseband processor 129 may generate and process signals to be transmitted to a wireless media by the RF transmitter 123b via the T/R switch 122 and the antenna 121. The RF transmitter 123b may comprise a polar transmitter and as such may be affected by AM/PM distortion. In an embodiment of the invention, the AM/PM distortion may be reduced by adding an offset in the digital domain, in the digital baseband processor 129, for example, and removing the offset signal in the analog domain, in the RF transmitter 123b, for example.

Figure 1B:
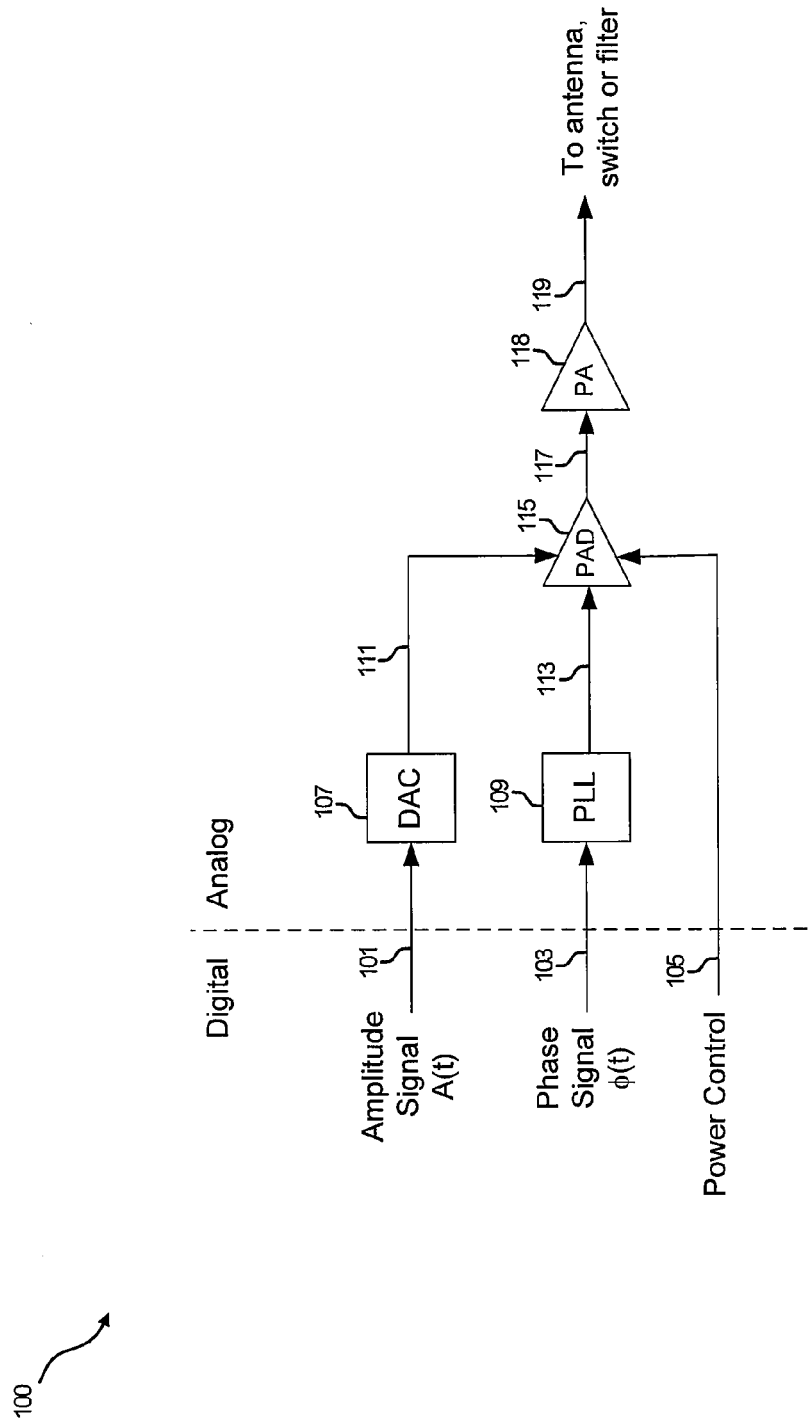
FIG. 1B is a block diagram of an exemplary polar transmitter, in accordance with an embodiment of the invention.

FIG. 1B is a block diagram of an exemplary polar transmitter, in accordance with an embodiment of the invention. Referring to FIG. 1B, there is shown a polar transmitter comprising a digital to analog converter (DAC) 107, a phase locked loop (PLL) 109, a power amplifier driver (PAD) 115, and a power amplifier (PA) 118. The exemplary polar transmitter 100 of FIG. 1B may be representative of the RF transmitter 123*b* of FIG. 1A.

The DAC 107 may comprise suitable circuitry, logic and/or code that may enable conversion of an incoming digital signal to an analog output. The DAC 107 may be enabled to receive an input signal, namely, amplitude signal A(t) 101. The DAC 107 may be enabled to generate an output signal 111 which may be communicated to an input of the PAD 115.

The PLL 109 may comprise suitable circuitry, logic and/or code that may enable generation of an analog output signal in relation to a digital input signal. The PLL 109 may be enabled to receive an input signal, namely phase signal φ(t) 103. The PLL 109 may be enabled to generate an output signal 113, which may be communicated to an input of the PAD 115.

The PAD 115 may comprise suitable circuitry, logic and/or code that may enable receiving of digital and analog input signals and generating an output signal for driving a power amplifier 118. The PAD 115 may be enabled to receive an input power control signal 105. Additionally, the PAD 115 may be enabled to receive as input signals, the output signal 113 generated by the PLL 109 and the output signal 111 generated by the DAC 107.

The PA 118 may comprise suitable circuitry, logic and/or code that may enable receiving of an input signal and generating an amplified output signal. The PA 118 may be enabled to receive an input signal 117 generated by the PAD 115. The PA 118 may be enabled to generate a signal that may be communicated to an antenna, switch or filter.

In operation, the amplitude signal A(t) 101 may be communicated to the input of the DAC 107 where it may be converted to an analog signal 111. The analog signal 111 may be communicated to an input of the PAD 115. The phase signal φ(t) 103 may be communicated to the input of the PLL 109, where it may be converted to a signal which may be expressed using the following relationship:

$$\cos[\omega_c t + \phi(t)]$$

where $\omega_c$ is the angular frequency of the PLL 109.

The amplitude signal A(t) 101 and the phase signal φ(t) 103 may comprise the two components of a polar signal. The power control 105 may be communicated to another input of the PAD 115. The power control 105 may be a digital code utilized for controlling the gain in the PAD 115. The PAD 115 may receive the output signals of the DAC 107 and the PLL 113 and generate a signal which may be expressed using the following relationship:

$$A(t)^* \cos[\omega_c t + \phi(t)].$$

The signal described by the above relationship may represent a polar signal 117 for communicating to the power amplifier 118. The amplitude of the polar signal 117 may be adjusted utilizing the power control 105. The power amplifier 119 may receive the polar signal 117 and generate an output signal 119 proportional to a product of the gain of the PA 118 and the polar signal 117. The output signal 119 may be communicated to an antenna for transmission, to a switch, or to a filter.

However, in instances where the phase signal, φ(t), may be affected by the variation of the amplitude signal, A(t), AM/PM distortion may be present, and the actual output signal may be expressed by the following relationship:

$$A(t)^* \cos\{(\omega_c t + \phi(t) + g[A(t)]\}$$

where g[A(t)] is a phase term that may be a function of the amplitude signal A(t). In instances where the magnitude of A(t) may vary significantly, the term g[A(t)] may become significant, which may cause significant AM/PM distortion.

The time variation in the phase signal, g[A(t)] may be larger in cases when the magnitude of A(t) is low. Thus, g[A(t)] may be reduced by adding an offset $A_0$ in the digital domain to the amplitude signal A(t), thereby maintaining the magnitude of the amplitude signal, $A(t)+A_0$, at a higher level. The addition of the offset $A_0$ may be described further with respect to FIG. 2.

In another embodiment of the invention, the phase signal φ(t), the amplitude signal A(t) and the offset signal $A_0$ may be communicated to the PA 118, as opposed to the PAD 115.

Figure 2:
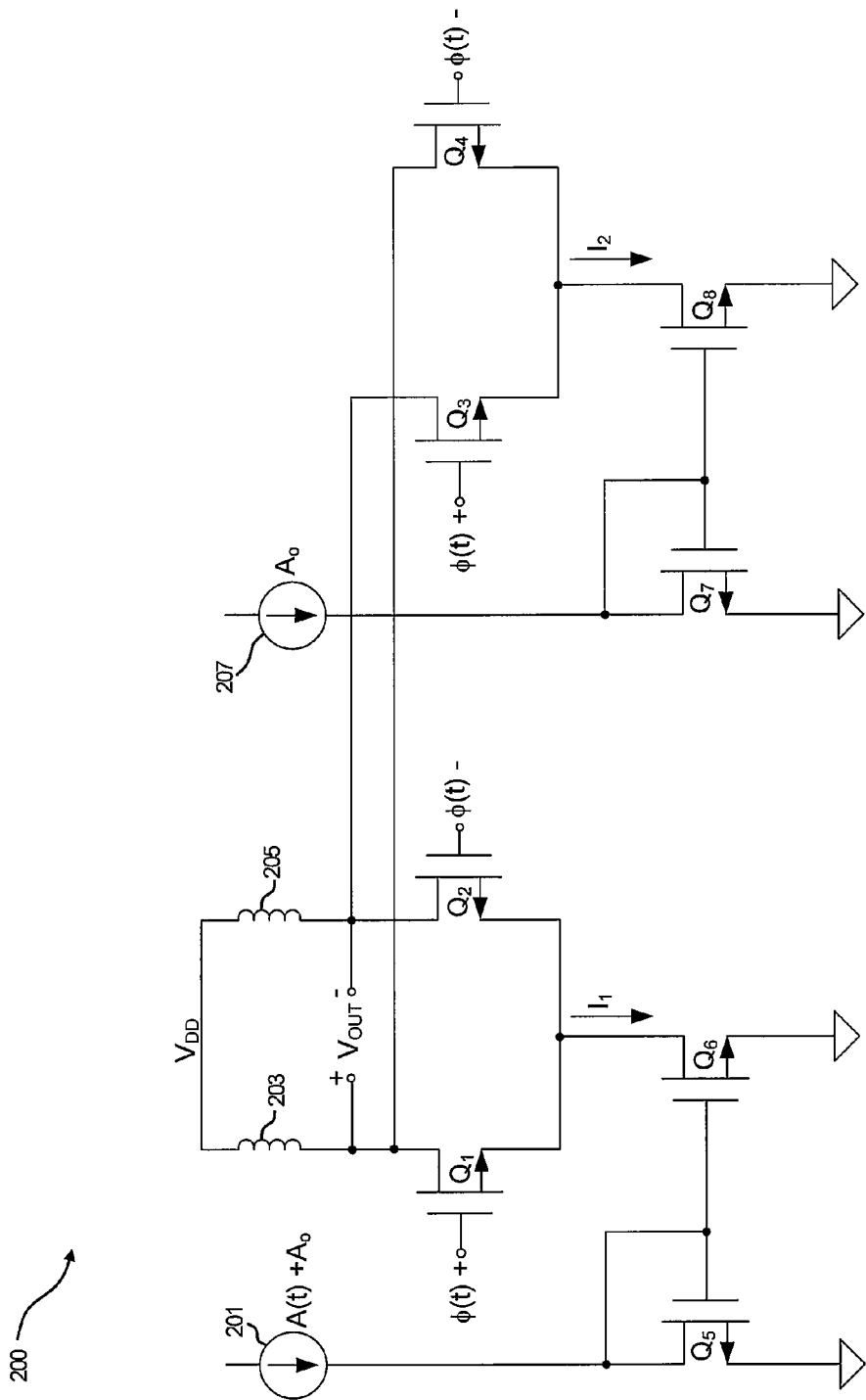
FIG. 2 is a block diagram illustrating an exemplary circuit for reducing AM/PM distortion, in accordance with an embodiment of the invention.

FIG. 2 is a block diagram illustrating an exemplary circuit for reducing AM/PM distortion, in accordance with an embodiment of the invention. Referring to FIG. 2, there is shown polar amplifier 200 comprising current sources 201 and 207, inductors 203 and 205, and transistors $Q_1$, $Q_2$, $Q_3$, $Q_4$, $Q_5$, $Q_6$, $Q_7$ and $Q_8$. The polar amplifier 200 may comprise a power amplifier driver or a power amplifier. The current source 201 may comprise suitable circuitry, logic and/or code that may be enabled to generate a current that represents the amplitude signal A(t) plus the offset signal $A_o$. The inductors 203 and 205 may be coupled to capacitors, not shown, to define a desired output impedance and tuning frequency of the power amplifier driver 200.

The transistors $Q_5$ and $Q_6$ and the transistors $Q_7$ and $Q_8$ may comprise current mirrors that may be enabled to communicate a current signal $I_1$ proportional to $A(t)+A_0$ and the current signal $I_2$ proportional to $A_0$ to the drain terminals of the transistors $Q_1$ and $Q_2$ and $Q_3$ and $Q_4$, respectively. The transistors $Q_1$ and $Q_2$ and the transistors $Q_3$ and $Q_4$ may comprise differential pairs that may be enabled to amplify the phase signal φ(t), that may be coupled to the base terminals of $Q_1$ and $Q_2$ and to $Q_3$ and $Q_4$, respectively. The drain terminal of the transistor $Q_3$ may be coupled to the drain terminal of the transistor $Q_2$, and the drain terminal of the transistor $Q_4$ may be coupled to the drain terminal of the transistor $Q_1$.

In operation, the current mirror comprising the transistors $Q_5$ and $Q_6$ may mirror the input current $A(t)+A_o$ generated by the current source 201 to generate a current $I_1$, which may be proportional to $A(t)+A_0$, to the source terminals of the differential transistor pair comprising the transistors $Q_1$ and $Q_2$. In this regard, the current mirror comprising the transistors $Q_7$ and $Q_8$ may mirror the input current $A_o$ generated by the current source 207 to generate a current $I_2$, which may be proportional to $A_0$, to the source terminals of the differential transistor pair comprising the transistors $Q_3$ and $Q_4$.

The phase signal φ(t) may be communicated to the base terminals of the transistors $Q_1/Q_2$ and $Q_3/Q_4$. The differential pair comprising the transistors $Q_1$ and $Q_2$ may mix the phase signal φ(t) with the current $I_1$, which may be proportional to the amplitude plus the offset signal, $A(t)+A_0$. The differential pair comprising the transistors $Q_3$ and $Q_4$ may mix the phase signal φ(t) with the current $I_2$, which may be proportional to the amplitude of the offset signal, $A_0$. If the offset signal $A_0$ were equal to zero, the output signal, $V_{OUT}$, may be expressed by the following relationship:

$$A(t)^* \cos[\omega_c t + \phi(t)]$$

as was given above for the ideal case of a polar signal with no AM/PM or AM/AM distortion with the PAD 115 described with respect to FIG. 1B.

In instances when the offset signal may be non-zero, the output signal, $V_{OFF}$, for the differential pair comprising the transistors $Q_3$ and $Q_4$, may be expressed by the following relationship:

$$A_0^* \cos[\omega_c t + \phi(t)]$$

By utilizing an offset signal $A_0$ of high enough magnitude, the variation of the phase signal versus the amplitude signal, denoted by $g[A(t)]$ above, may be minimized, or essentially a constant, denoted by $\phi_0$, rendering it ineffective as a source of AM/PM distortion. Because the outputs of the differential pairs comprising $Q_1/Q_2$ and $Q_3/Q_4$ may be coupled with the opposite polarity, that is, the drain of $Q_3$, which may correspond to the positive input terminal for the phase signal $\phi(t)$, may be coupled to the drain of the transistor $Q_2$, which may correspond to the negative input terminal for the phase signal $\phi(t)$, this may result in the cancellation of the portion of the output voltage generated as a result of the offset signal $A_0$ for both differential pairs, effectively mitigating AM/PM distortion, and may also reduce AM/AM distortion. In this manner, the output voltage $V_{OUT}$ may be expressed by the following relationship:

$$(A(t)+A_0)*\cos[\omega_c t+\phi(t)+\phi_0]-A_0*\cos[\omega_c t+\phi(t)+\phi_0]=A(t)*\cos[\omega_c t+\phi(t)+\phi_0]$$

which may be equal to the desired output signal, in which a constant phase offset such as $\phi_0$ does not affect the phase noise.

Figure 3:
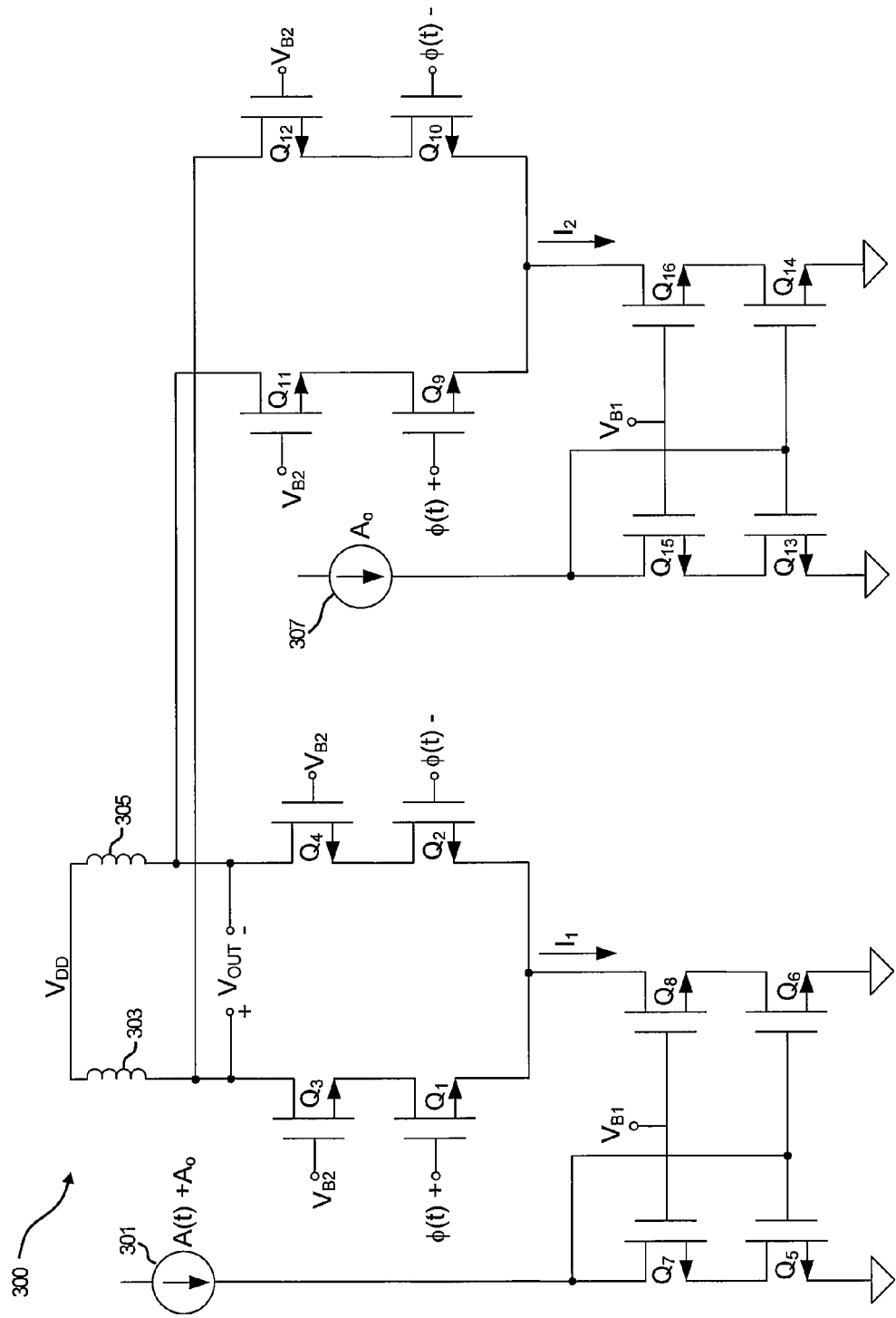
FIG. 3 is a block diagram illustrating an exemplary cascode circuit for reducing AM/PM distortion, in accordance with an embodiment of the invention.

FIG. 3 is a block diagram illustrating an exemplary cascode circuit for reducing AM/PM distortion, in accordance with an embodiment of the invention. Referring to FIG. 3, there is shown polar amplifier 300 comprising current sources 301 and 307, inductors 303 and 305, and transistors $Q_1$-$Q_{16}$. The polar amplifier 300 may comprise a power amplifier driver or a power amplifier. The current source 301 may comprise suitable circuitry, logic and/or code that may be enabled to generate a current that represents the amplitude signal $A(t)$ plus the offset signal $A_o$. The inductors 303 and 305 may be coupled to capacitors, not shown, to define a desired output impedance and tuning frequency of the power amplifier driver 300.

The transistors $Q_5$, $Q_6$, $Q_7$ and $Q_8$ may comprise a cascode current mirror that may be enabled to communicate a current signal $I_t$ proportional to $A(t)+A_0$ to the drain terminals of the transistors $Q_1$ and $Q_2$. The transistors $Q_{13}$, $Q_{14}$, $Q_{15}$ and $Q_{16}$ may comprise a cascode current mirror that may be enabled to communicate a current signal $I_2$ proportional to $A_0$ to the source terminals of the transistors $Q_9$ and $Q_{10}$. The transistors $Q_1$, $Q_2$, $Q_3$ and $Q_4$ may comprise a cascode differential pair that may be enabled to amplify the phase signal $\phi(t)$, which may be coupled to the base terminals of $Q_1$ and $Q_2$. The transistors $Q_9$, $Q_{10}$, $Q_{11}$ and $Q_{12}$ may comprise a cascode differential pair that may be enabled to amplify the phase signal $\phi(t)$, that may be coupled to the base terminals of $Q_9$ and $Q_{10}$. The drain terminal of the transistor $Q_3$ may be coupled to the drain terminal of the transistor $Q_{11}$, and the drain terminal of the transistor $Q_4$ may be coupled to the drain terminal of the transistor $Q_{12}$.

The cascode configurations for the circuit illustrated in FIG. 3 may increase the linearity of the current sources comprising the transistors $Q_5$, $Q_6$, $Q_7$ and $Q_8$ and $Q_{13}$, $Q_{14}$, $Q_{15}$ and $Q_{16}$ compared to the current sources described with respect to FIG. 2. In addition, the isolation of the cascode differential pairs comprising the transistors $Q_1$, $Q_2$, $Q_3$ and $Q_4$ and $Q_9$, $Q_{10}$, $Q_{11}$ and $Q_{12}$ may be increased due to the increased output impedance of the cascode as compared to the differential pairs described with respect to FIG. 2. The bias voltages $V_{B1}$ and $V_{B2}$ may be adjusted to activate or deactivate the circuit.

In operation, the cascode current mirror comprising the transistors $Q_5$, $Q_6$, $Q_7$ and $Q_8$ may mirror the input current $A(t)+A_o$ generated by the current source 301 to generate a current $I_1$, which may be proportional to $A(t)+A_0$, to the common source terminals of the transistors $Q_1$ and $Q_2$ of the cascode differential transistor pair comprising the transistors $Q_1$, $Q_2$, $Q_3$ and $Q_4$. The cascode current mirror comprising the transistors $Q_{13}$, $Q_{14}$, $Q_{15}$ and $Q_{16}$ may mirror the input current $A_o$ generated by the current source 307 to generate a current $I_2$, which may be proportional to $A_0$, to the common source terminals of the transistors $Q_9$ and $Q_{10}$ of the cascode differential transistor pair comprising the transistors $Q_9$, $Q_{10}$, $Q_{11}$ and $Q_{12}$.

The phase signal $\phi(t)$ may be communicated to the base terminals of the transistors $Q_1/Q_2$ and $Q_9/Q_{10}$. The cascode differential pair comprising the transistors $Q_1$, $Q_2$, $Q_3$ and $Q_4$ may mix the phase signal $\phi(t)$ with the current $I_1$, which may be proportional to the amplitude signal plus the offset signal, $A(t)+A_0$. The differential pair comprising the transistors $Q_9$, $Q_{10}$, $Q_{11}$ and $Q_{12}$ may mix the phase signal $\phi(t)$ with the current $I_2$, which may be proportional to the amplitude of the offset signal, $A_0$. If the offset signal $A_0$ were equal to zero, the output signal, $V_{OUT}$, may be expressed by the following relationship:

$$A(t)*\cos[\omega_c t+\phi(t)]$$

as was given above for the ideal case of a polar signal with no AM/PM or AM/AM distortion with the PAD 115 described with respect to FIG. 1B.

By utilizing an offset signal $A_0$ of high enough magnitude, the variation of the phase signal versus the amplitude signal, denoted by $g[A(t)]$ above, may be minimized, or essentially a constant, denoted by $\phi_0$, rendering it ineffective as a source of AM/PM distortion. Because the cascode differential pairs comprising the transistors $Q_1$, $Q_2$, $Q_3$ and $Q_4$ and $Q_9$, $Q_{10}$, $Q_{11}$ and $Q_{12}$ may be coupled with the opposite polarity, i.e. the drain of $Q_{11}$, which may correspond to the positive input terminal for the phase signal $\phi(t)$, may be coupled to the drain of the transistor $Q_4$, which may correspond to the negative input terminal for the phase signal $\phi(t)$, this may result in the cancellation of the portion of the output voltage generated as a result of the offset signal $A_0$ for both cascode differential pairs, effectively mitigating AM/PM distortion, and may also reduce AM/AM distortion. In this manner, the output voltage $V_{OUT}$ may be expressed by the following relationship:

$$(A(t)+A_0)*\cos[\omega_c t+\phi(t)+\phi_0]-A_0*\cos[\omega_c t+\phi(t)+\phi_0]=A(t)*\cos[\omega_c t+\phi(t)+\phi_0]$$

which may equal the desired output signal, in which a constant phase offset such as $\phi_0$ does not affect the phase noise.

Figure 4:
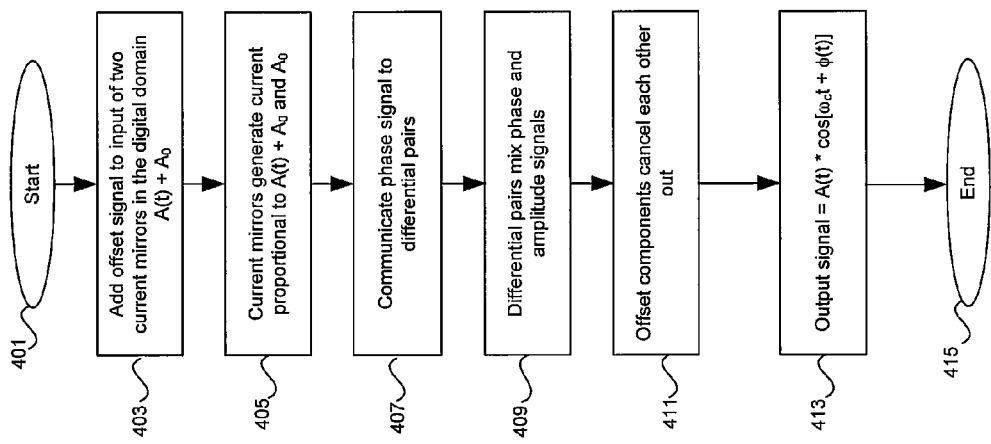
FIG. 4 is a flow diagram illustrating exemplary steps in the reduction of AM/PM and AM/AM distortion in a polar amplifier, in accordance with an embodiment of the invention.

FIG. 4 is a flow diagram illustrating exemplary steps in the reduction of AM/PM and AM/AM distortion in a polar amplifier, in accordance with an embodiment of the invention. Referring to FIG. 4, in step 403, the current source 201 may generate a current comprising an amplitude signal, $A(t)$ added to an offset signal, $A_0$. The offset signal, $A_0$ may also be generated by the current source 207. The current mirrors comprising the transistors $Q_5/Q_6$ and $Q_7/Q_8$ may generate currents $I_1$ and $I_2$ proportional to $A(t)+A_0$ and $A_0$, respectively. In step 407, the phase signal, $\phi(t)$ may be communicated to the gate terminals of the differential pairs comprising $Q_1/Q_2$ and $Q_3/Q_4$. In step 409, the phase signal $\phi(t)$ may be mixed with the current $I_1$ and $I_2$ by the differential pairs comprising $Q_1/Q_2$ and $Q_3/Q_4$, respectively. In step 409, due to the polarity of the output signals of the differential pairs comprising $Q_1/Q_2$ and $Q_3/Q_4$, the offset signal may be cancelled out, resulting in the desired output signal, $A(t)\cos[\omega_c t+\phi(t)]$ in step 413, followed by end step 415.

In an exemplary embodiment of the invention, in a polar amplifier, an offset signal $A_0$ may be added to an amplitude signal $A(t)$ in the digital domain and removed in the analog domain. A sum of the amplitude signal and the offset signal may be mixed with a phase signal $\phi(t)$ in a first differential amplifier $Q_1/Q_2$ to generate a first voltage signal, and the offset signal $A_0$ may be mixed with the phase signal $\phi(t)$ in a second differential amplifier $Q_3/Q_4$ to generate a second voltage signal. The second voltage signal may be subtracted from the generated first voltage signal. The amplitude and offset signals, A(t) and $A_0$, may be mixed with the phase signal $\phi(t)$ by modulating a current in the differential amplifiers $Q_1/Q_2$ and/or $Q_3/Q_4$, which may comprise cascode differential amplifiers $Q_1$, $Q_2$, $Q_3$ and $Q_4$ and/or $Q_9$, $Q_{10}$, $Q_{11}$ and $Q_{12}$. The modulated currents $I_1$ and $I_2$ may be generated using a current source 201 and 207 and a current mirror circuit, which may comprise a cascode current mirror $Q_5$, $Q_6$, $Q_7$ and $Q_8$ and $Q_{13}$, $Q_{14}$, $Q_{15}$ and $Q_{16}$. The polar amplifier may comprise a power amplifier driver or a power amplifier.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for controlling a circuit, the method comprising:
   in a polar amplifier during polar modulation, adding an offset signal to an amplitude signal in a digital domain;
   mixing said added offset signal and amplitude signal with a phase signal to generate a first voltage signal; and
   removing said offset signal in an analog domain.

2. The method according to 1, comprising mixing said offset signal with said phase signal to generate a second voltage signal.

3. The method according to 2, comprising subtracting said generated second voltage signal from said generated first voltage signal.

4. The method according to 1, comprising modulating a current in a differential amplifier within said polar amplifier utilizing a sum of said amplitude signal and said offset signal.

5. The method according to 4, wherein said differential amplifier comprises a cascode differential amplifier.

6. The method according to 4, wherein said modulated current is generated using a current source and a current mirror circuit.

7. The method according to 6, wherein said current mirror circuit comprises a cascode current mirror.

8. The method according to 1, comprising modulating a current in a differential amplifier within said polar amplifier utilizing said offset signal.

9. The method according to 8, wherein said differential amplifier comprises a cascode differential amplifier.

10. The method according to 8, wherein said modulated current is generated using a current source and a current mirror circuit.

11. The method according to 10, wherein said current mirror circuit comprises a cascode current mirror.

12. The method according to 1, wherein said polar amplifier is a power amplifier driver.

13. The method according to 1, wherein said polar amplifier is a power amplifier.

14. A method for controlling a circuit, the method comprising:
   in a polar amplifier during polar modulation, adding an offset signal to an amplitude signal in a digital domain;
   modulating a current in a differential amplifier within said polar amplifier utilizing a sum of said amplitude signal and said offset signal; and
   removing said offset signal in an analog domain.

15. The method according to claim 14, wherein said differential amplifier comprises a cascode differential amplifier.

16. The method according to claim 14, wherein said modulated current is generated using a current source and a current mirror circuit.

17. The method according to claim 16, wherein said current mirror circuit comprises a cascode current mirror.

18. The method according to claim 14, comprising modulating a current in a differential amplifier within said polar amplifier utilizing said offset signal.

19. The method according to claim 18, wherein said differential amplifier comprises a cascode differential amplifier.

20. The method according to claim 18, wherein said modulated current is generated using a current source and a current mirror circuit.

21. The method according to claim 20, wherein said current mirror circuit comprises a cascode current mirror.

22. The method according to claim 14, wherein said polar amplifier is a power amplifier driver.

23. The method according to claim 14, wherein said polar amplifier is a power amplifier.

24. A method for controlling a circuit, the method comprising:
  in a polar amplifier during polar modulation, adding an offset signal to an amplitude signal in a digital domain;
  modulating a current in a differential amplifier within said polar amplifier utilizing said offset signal; and
  removing said offset signal in an analog domain.

25. The method according to claim 24, wherein said differential amplifier comprises a cascode differential amplifier.

26. The method according to claim 24, wherein said modulated current is generated using a current source and a current mirror circuit.

27. The method according to claim 26, wherein said current mirror circuit comprises a cascode current mirror.

28. The method according to claim 24, wherein said polar amplifier is a power amplifier driver.

29. The method according to claim 24, wherein said polar amplifier is a power amplifier.

30. A system for controlling transmission of signals in a communication system, the system comprising:
  one or more circuits comprising a polar amplifier that adds an offset signal to an amplitude signal in a digital domain during polar modulation;
  said one or more circuits mixes said summed offset signal and said amplitude signal with a phase signal to generate a first voltage signal; and
  said one or more circuits removes said offset signal in an analog domain.

31. The system according to claim 30, wherein said one or more circuits mixes said offset signal with said phase signal to generate a second voltage signal.

32. The system according to claim 31, wherein said one or more circuits subtracts said generated second voltage signal from said generated first voltage signal.

33. The system according to claim 30, wherein said one or more circuits comprises a differential amplifier integrated within said polar amplifier, and a current in said differential amplifier is modulated utilizing said offset signal.

34. The system according to claim 33, wherein said differential amplifier comprises a cascode differential amplifier.

35. The system according to claim 33, wherein said one or more circuits modulates said current in said differential amplifier using a current source and a current mirror circuit.

36. The system according to claim 35, wherein said current mirror circuit comprises a cascode current mirror.

37. The system according to claim 30, wherein said one or more circuits comprises a differential amplifier integrated within said polar amplifier, and a current in said differential amplifier is modulated utilizing said offset signal.

38. The system according to claim 37, wherein said differential amplifier comprises a cascode differential amplifier.

39. The system according to claim 37, wherein said one or more circuits modulates said current in said differential amplifier using a current source and a current mirror circuit.

40. The system according to claim 39, wherein said current mirror circuit comprises a cascode current mirror.

41. The system according to claim 30, wherein said polar amplifier comprises a power amplifier driver.

42. The system according to claim 30, wherein said polar amplifier comprises a power amplifier.

43. A system for controlling transmission of signals in a communication system, the system comprising:
  one or more circuits comprising a polar amplifier that adds an offset signal to an amplitude signal in a digital domain during polar modulation;
  said one or more circuits comprises a differential amplifier integrated within said polar amplifier, and a current in said differential amplifier is modulated utilizing said offset signal; and
  said one or more circuits removes said offset signal in an analog domain.

44. The system according to claim 43, wherein said differential amplifier comprises a cascode differential amplifier.

45. The system according to claim 43, wherein said one or more circuits modulates said current in said differential amplifier using a current source and a current mirror circuit.

46. The system according to claim 45, wherein said current mirror circuit comprises a cascode current mirror.

47. The system according to claim 43, wherein said one or more circuits comprises a differential amplifier integrated within said polar amplifier, and a current in said differential amplifier is modulated utilizing said offset signal.

48. The system according to claim 47, wherein said differential amplifier comprises a cascode differential amplifier.

49. The system according to claim 47, wherein said one or more circuits modulates said current in said differential amplifier using a current source and a current mirror circuit.

50. The system according to claim 49, wherein said current mirror circuit comprises a cascode current mirror.

51. The system according to claim 43, wherein said polar amplifier comprises a power amplifier driver.

52. The system according to claim 43, wherein said polar amplifier comprises a power amplifier.

53. A system for controlling transmission of signals in a communication system, the system comprising:
  one or more circuits comprising a polar amplifier that adds an offset signal to an amplitude signal in a digital domain during polar modulation;
  said one or more circuits comprises a differential amplifier integrated within said polar amplifier, and a current in said differential amplifier is modulated utilizing said offset signal; and
  said one or more circuits removes said offset signal in an analog domain.

54. The system according to claim 53, wherein said differential amplifier comprises a cascode differential amplifier.

55. The system according to claim 53, wherein said one or more circuits modulates said current in said differential amplifier using a current source and a current mirror circuit.

56. The system according to claim 55, wherein said current mirror circuit comprises a cascode current mirror.

57. The system according to claim 53, wherein said polar amplifier comprises a power amplifier driver.

58. The system according to claim 53, wherein said polar amplifier comprises a power amplifier.

* * * * *